United States Patent [19]

De Jong et al.

[11] Patent Number: 5,006,476
[45] Date of Patent: Apr. 9, 1991

[54] TRANSISTOR MANUFACTURING PROCESS USING THREE-STEP BASE DOPING

[75] Inventors: Jan L. De Jong, San Jose, Calif.; Jacob G. DeGroot, TA Malden, Netherlands

[73] Assignee: North American Philips Corp., Signetics Division, Sunnyvale, Calif.

[21] Appl. No.: 440,456

[22] Filed: Nov. 20, 1989

Related U.S. Application Data

[63] Continuation of Ser. No. 241,526, Sep. 7, 1988, abandoned.

[51] Int. Cl.$^5$ ............................................. H01L 21/265
[52] U.S. Cl. .................................... 437/31; 437/32; 437/56; 437/57; 437/162; 437/63; 437/917; 148/DIG. 9; 148/DIG. 124
[58] Field of Search ................ 437/31, 32, 56, 57, 437/162, 48, 51, 61, 63, 200, 917; 148/DIG. 147, DIG. 124, DIG. 9; 357/34, 35, 43

[56] References Cited

U.S. PATENT DOCUMENTS 4,539,744 9/1985 Burton .............................. 29/571
4,587,718 5/1986 Haken et al. ...................... 29/571

FOREIGN PATENT DOCUMENTS 0114861 7/1984 Japan .
0050920 3/1985 Japan .
0103669 6/1985 Japan .
2168845 6/1986 United Kingdom .

OTHER PUBLICATIONS

Chen et al., "An Advanced Bipolar Transistor with Self-Aligned Ion-Implanted Base and W/Poly Emitter", IEEE Trans. Elec. Devs., vol. 35, No. 8, 8/88, pp. 1322-1327.
Cole, "Is BiCMOS The Next Technology Driver?", Electronics, Feb. 4, 1988, pp. 55-57.
Alverez et al., "2 Micron Merged Bipolar-CMOS Technology", IEDM Tech. Dig., Dec. 9-12, 1984, pp. 761-764.
Cuthbertson et al., "Self-Aligned Transistor with Polysilicon Emitters for Bipolar VLSI", IEEE Trans. Elec. Devs., Feb. 1985, pp. 242-247.
Konaka et al., "A 20 ps/G. Si Bipolar IC Using Advanced SST with Collector Ion Implantation," Extended Abs., 19th Conf. Solid State Devs. & Mats., 1987, pp. 331-334.

Primary Examiner—Brian E. Hearn
Assistant Examiner—Tuan Nguyen
Attorney, Agent, or Firm—T. Briody; A. Tamoshunas; R. Meetin

[57] ABSTRACT

In a transistor fabrication process, the use of a three-step base doping technique enables the characteristics of a vertical bipolar transistor to be controllably reproduced at highly optimal values from run to run. Insulating spacers (52A) are employed in forming a self-aligned base contact zone (58B). A shallow emitter (46) is created by outdiffusion from a patterned non-monocrystalline semiconductor layer (38A) that serves as the emitter contact. The fabrication process is compatible with the largely simultaneous manufacture of an insulated-gate field-effect transistor of the lightly doped drain type.

20 Claims, 5 Drawing Sheets

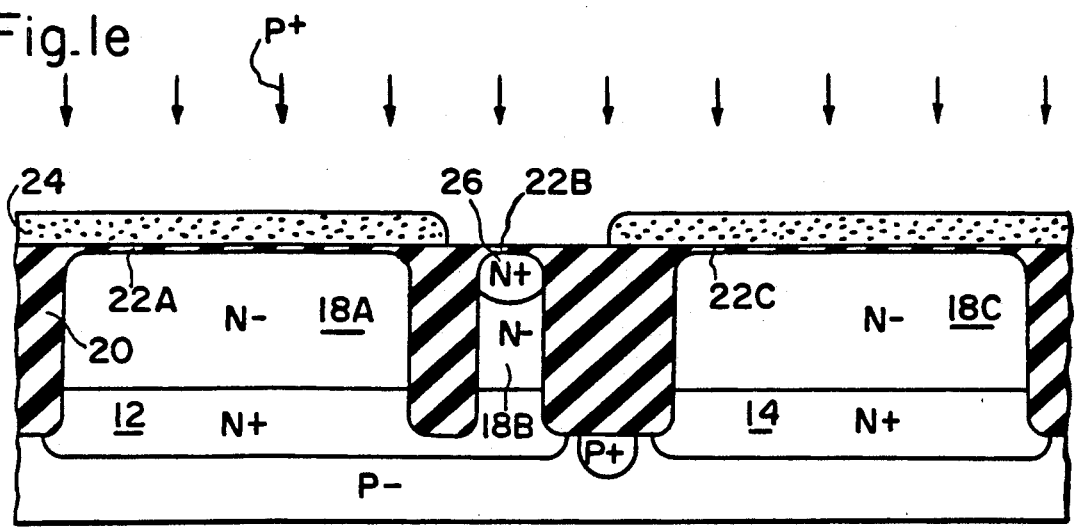
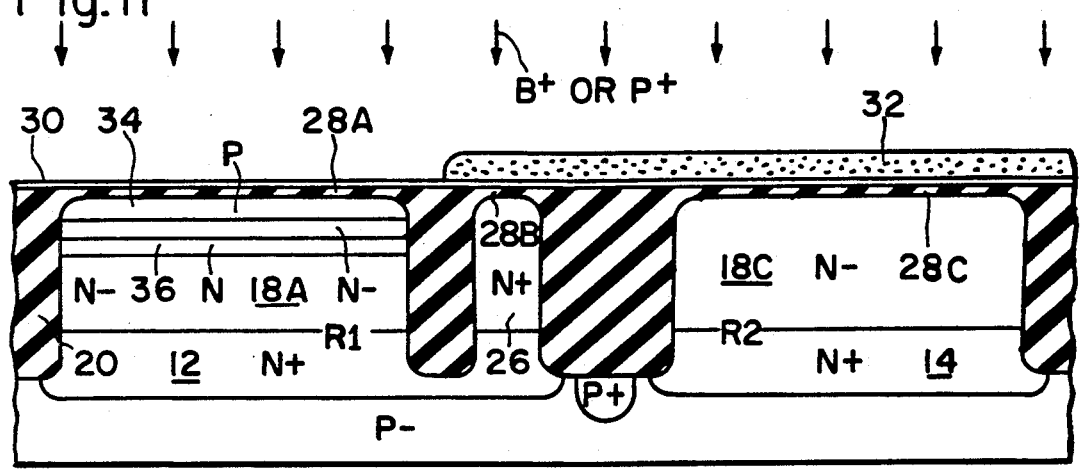
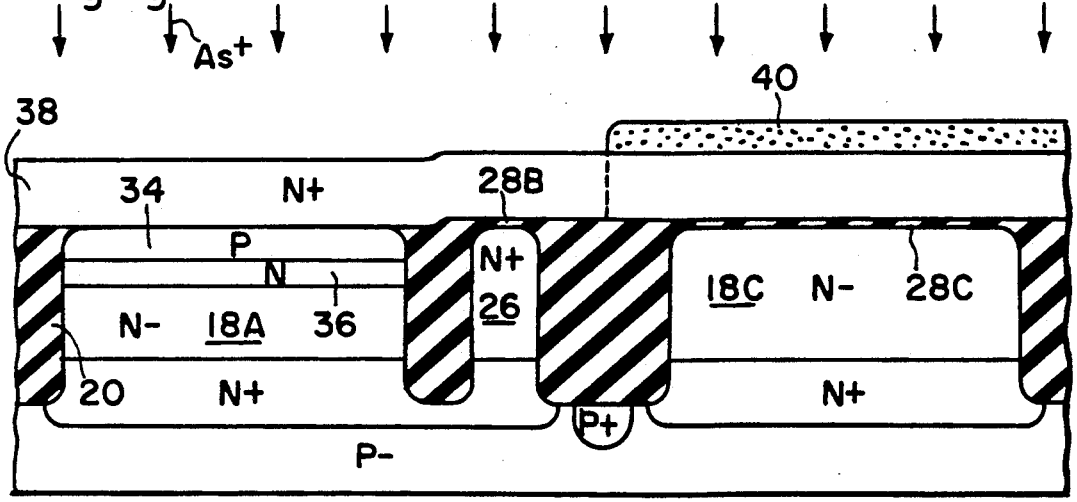

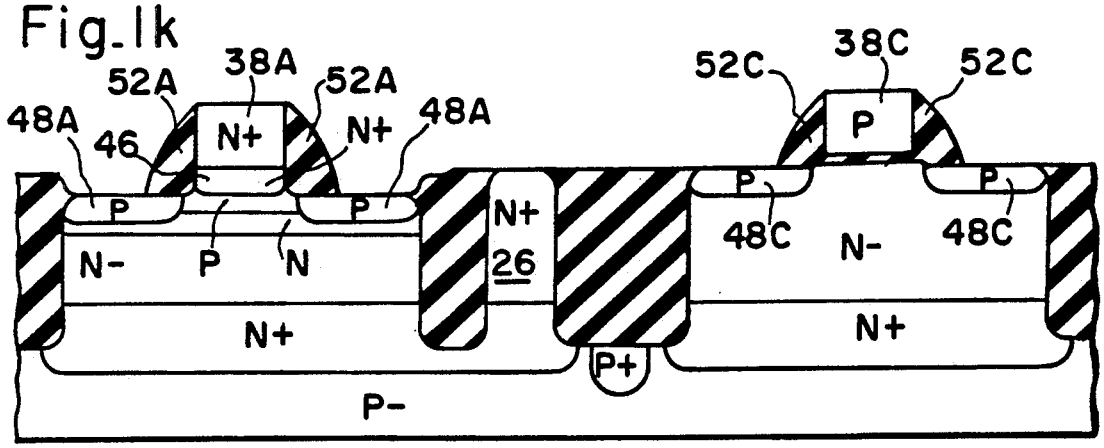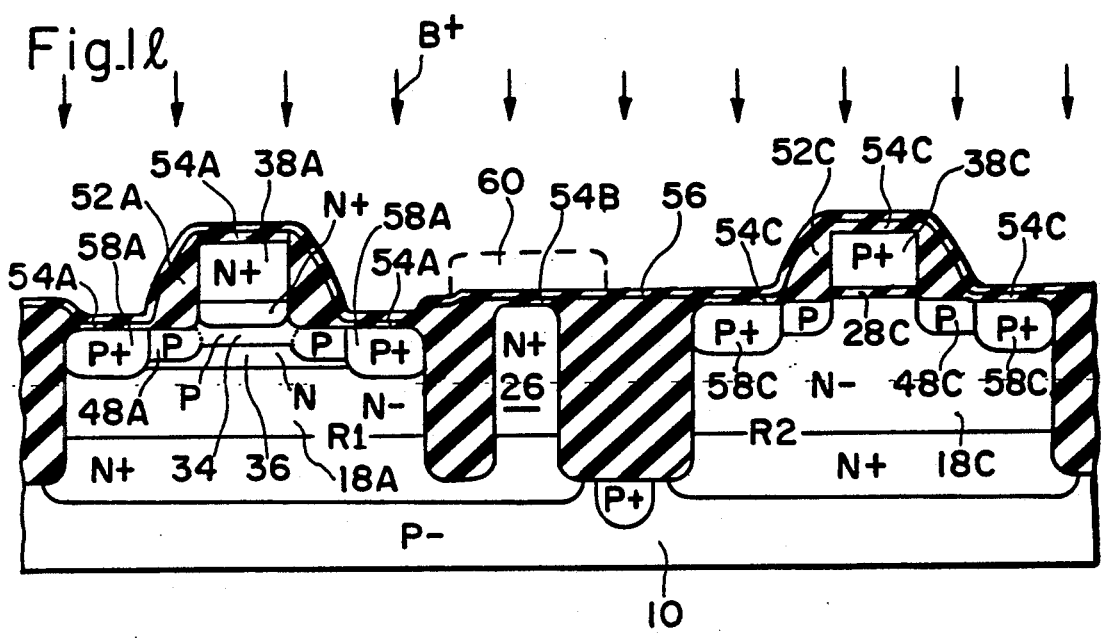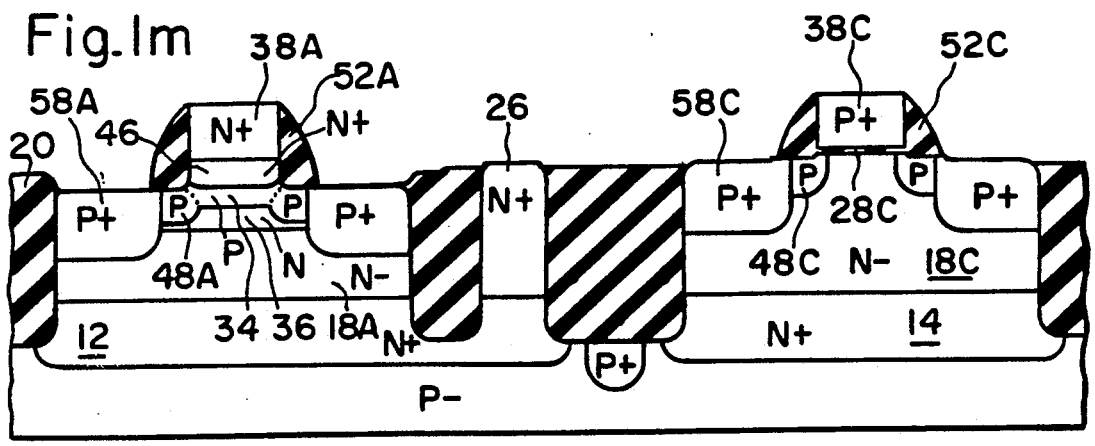

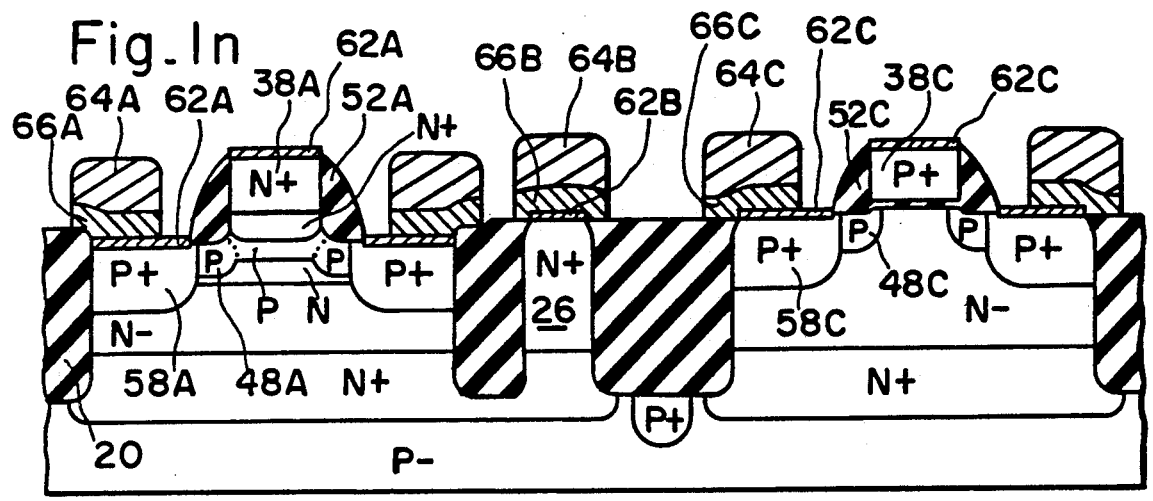
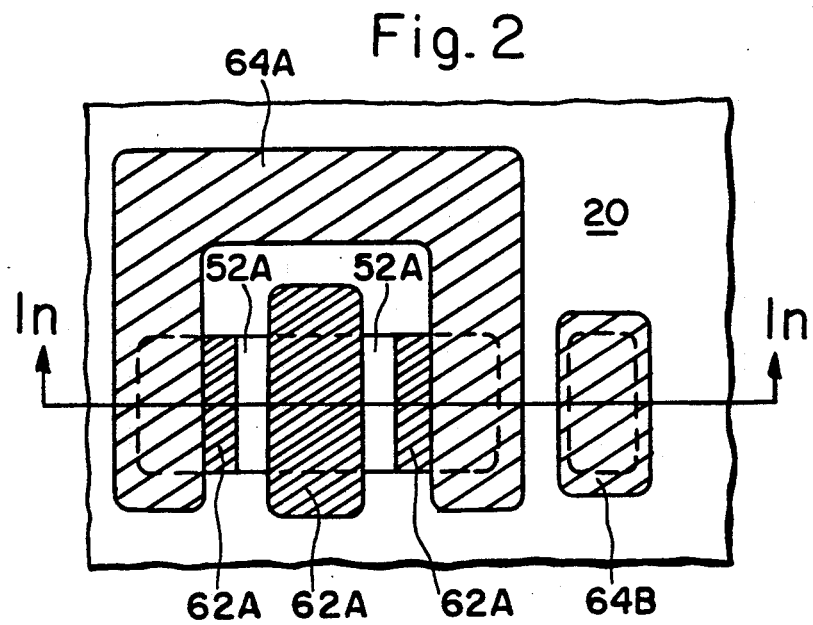

5,006,476

TRANSISTOR MANUFACTURING PROCESS USING THREE-STEP BASE DOPING

CROSS REFERENCE TO RELATED APPLICATION

This is a continuation of U.S. patent application Ser. No. 241,526, filed 7 Sept. 1988, now abandoned.

FIELD OF USE

This invention relates to methods of fabricating transistors.

BACKGROUND ART

A bipolar transistor consisting of an emitter, a base, and a collector is typically created in a vertical arrangement from a monocrystalline semiconductor body having a pair of generally flat opposing surfaces. The emitter is located in the semiconductor material along one of the two surfaces, referred to here (for convenience) as the upper surface. The base is composed of an intrinsic base portion and one or two extrinsic base portions. The intrinsic base (portion) lies directly under the emitter. Each extrinsic base (portion) consists of a connection zone and a heavily doped contact zone which reaches the upper surface at a location laterally separated from the emitter. The connection zone provides an electrical path between the intrinsic base and the contact zone.

The main part of the collector is situated below the intrinsic base so that the emitter-to-collector current generally flows in the vertical direction. The collector also includes at least one heavily doped contact zone. A set of overlying electrical contacts to the emitter and to the various contact zones complete the transistor.

For future high-speed applications, the emitter and the intrinsic base need to be quite shallow. Also, the emitter needs to be close to the base contact zone(s), but not so close as to create a significant risk of an electrical short between the contacts. These objectives can be achieved with a manufacturing process in which the emitter is formed in a self-aligned manner by impurity outdiffusion from a doped non-monocrystalline semiconductor layer that later serves as the emitter contact. Electrically insulating spacers along the sides of the non-monocrystalline layer are used in creating the base contact zone(s) in a self-aligned manner. The sidewall spacers also help separate the base contact zone(s) from the non-monocrystalline layer.

In published European Patent Application No. 193,934, Iwasaki discloses how an NPN transistor is manufactured according to one version of the foregoing process. Iwasaki manufactures a P-channel insulated-gate field-effect transistor (FET) in conjunction with the NPN device. The two transistors are built from a monocrystalline silicon (sometimes simply "monosilicon") body that contains a pair of major N-type regions, referred to here as the first and second regions, spaced apart from each other along the upper surface of the body. The NPN transistor is formed from the first region. The second region is used for the P-channel FET.

Iwasaki provides an oxide layer along the upper surfaces of the two N-type regions. Boron is ion implanted into the first region through the oxide layer to convert a surface-adjoining portion into a primary P-type zone. Part of the P-type zone later serves as both the intrinsic base portion and the base connection zone. An emitter diffusion window is etched through the oxide down to the P-type zone.

A pair of patterned N-doped polycrystalline silicon (often simply "polysilicon") layers, referred to here as the first and second patterned layers, are created on parts of the oxide respectively overlying the first and second regions. Part of the polysilicon fills the emitter diffusion window. Iwasaki now provides oxide spacers along the sides of the patterned layers. At some point during the formation of the spacers and patterned layers, part of the N-type impurity in the first patterned layer diffuses through the window into the underlying monosilicon to convert a portion of the P-type zone into an N-type emitter for the NPN transistor. The first and second patterned layers serve respectively as the emitter contact for the NPN transistor and the gate electrode for the FET.

Boron is ion implanted into the major regions through selected parts of their upper surfaces to establish a surface-adjoining portion of the first region as a heavily doped P-type base contact zone for the NPN device and to establish a pair of surface-adjoining portions of the second region as heavily doped P-type source/drain (S/D) zones for the FET. The spacers and patterned layers act as an implantation shield (or mask) during this step.

Iwasaki's process is attractive because largely the same steps are used in fabricating both transistors. However, controlling the process variables so as to obtain good transistor characteristics from fabrication run to fabrication run presents a major problem for Iwasaki.

More specifically, the resistance of the extrinsic base portion of a bipolar transistor limits the switching speed and thus needs to be quite low. In Iwasaki's vertical NPN device, the extrinsic base resistance is highly dependent on the proximity of the emitter to the base contact zone. The distance between these two regions depends, in turn, on how much they diffuse laterally towards each other. Due to normal processing variations, it is quite difficult for Iwasaki to control the lateral diffusion in such a way as to achieve a low extrinsic base resistance without impairing other transistor properties.

The gate electrode of an insulated-gate FET needs to (vertically) overlap its source/drain zones slightly for the FET to perform well. Although not specifically discussed by Iwasaki, the requisite overlap for his P-channel FET is achieved through lateral diffusion of the same dopant used to create the base contact zone for the NPN transistor. This further complicates the control problem.

The extrinsic base resistance in Iwasaki's NPN transistor will, of course, be unduly high if the emitter and base contact zone are too far apart. Conversely, the emitter-base junction breakdown voltage will be undesirably low if the base contact zone gets too close to the emitter. The capacitance along the lateral periphery of the emitter-base junction (hereafter simply "emitter-base peripheral capacitance") increases significantly. This reduces the switching speed. Non-ideal transistor characteristics, such as tunneling, also arise when the spacing between the emitter and base contact zone is too little.

Scovell et al, published European Patent Application No. 199,061, discloses a slightly different technique for using emitter contact outdiffusion and oxide spacers to fabricate a vertical NPN transistor. The starting point in Scovell et al is a monocrystalline silicon substrate that contains a major N-type region located along the upper substrate surface. A thin silicon dioxide layer lies on the upper surface. Boron is implanted into the major region through part of the oxide layer to form a primary P-type zone, after which the oxide over the P-type zone is removed.

A patterned layer of polycrystalline silicon containing an N-type impurity is created on part of the upper surface of the P-type zone. The patterned layer is formed by depositing a blanket polysilicon layer on the upper surface of the structure, doping the blanket layer with the N-type impurity, and performing a dry etch to remove the entire thickness of portions of the blanket layer situated to the sides of the intended location for the emitter. Stopping the dry etch precisely at the upper surface of the substrate is extremely difficult. Some of the underlying monosilicon is invariably etched away. Scovell et al control the etch in such a way that less than 500 angstroms of monosilicon is removed.

Oxide spacers are provided along the sides of the remaining polysilicon, preferably by thermal oxidation. During the spacer formation, part of the N-type impurity in the polysilicon diffuses into the underlying monosilicon to form the emitter. Using the spacers and the patterned polysilicon as a mask, boron is implanted into the major region to create a pair of heavily doped P-type base contact zones. The remaining polysilicon is the emitter contact.

The dry etch into the monosilicon during the polysilicon patterning step in Scovell et al elevates the emitter with respect to the extrinsic base portions. The resultant decrease in the emitter-base peripheral parasitic capacitance acts to increase the transistor switching speed. However, the monosilicon etch also removes a great amount of the boron in the base connection zones. This increases the extrinsic base resistance substantially. Reproducibly controlling the transistor characteristics affected by the extrinsic base dopant profile is largely as much a problem as in Iwasaki.

GENERAL DISCLOSURE OF THE INVENTION

The present invention is a transistor manufacturing process in which the characteristics of a vertical bipolar transistor, whose emitter is shallow and whose base comprises a shallow intrinsic portion and an adjoining extrinsic portion, can be reproduced at highly optimal values from run to run. This is accomplished principally by using a three-step base doping technique to create the base. The three-step doping technique substantially improves the ability to control the electrical properties of the extrinsic base portion. A low extrinsic base resistance can thus be achieved from run to run while simultaneously obtaining a fully adequate emitter-base breakdown voltage.

The emitter-base peripheral capacitance is quite low in a preferred version of the invention. This factor in combination with the low extrinsic base resistance and the shallow nature of the emitter and intrinsic base enables the transistor to switch very fast.

Emitter contact outdiffusion is preferably employed to form the emitter. The extrinsic base consists of a connection zone and a contact zone that is created in a self-aligned manner with the assistance of insulating spacers. The process of the invention is compatible with the largely simultaneous manufacture of an insulated-gate FET. The invention thus attains the advantages of the prior art references discussed above without incurring their disadvantages.

More specifically, the emitter is of a first conductivity type (e.g., N-type). The base is of a second conductivity type (e.g., P-type) opposite to the first conductivity type. The bipolar transistor is fabricated from a monocrystalline semiconductor body that comprises a major region of the first conductivity type located along the upper surface of the body. An initial dopant of the second conductivity type is introduced into the major region to convert a surface-adjoining portion into a primary zone of the second conductivity type. Part of the primary zone later serves as the intrinsic base.

In conjunction with formation of the primary zone, a preliminary impurity of the first conductivity type may be ion implanted into the major region to an average depth greater than that of the initial dopant of the second conductivity type. This implantation increases the dopant concentration along the base-collector junction so as to suppress the base "push-out" effect. The width of the intrinsic base is also reduced. The overall result is a further increase in switching speed.

A patterned conductive layer usually consisting of non-monocrystalline semiconductive material that contains a main impurity of the first conductivity type is created above the primary zone so as to contact part of its upper surface. The patterned layer is preferably created by providing the upper surface of the structure with a blanket non-monocrystalline semiconductor layer doped with the main impurity and then removing the entire thickness of portions of the blanket layer situated to the sides of the intended location for the emitter. At least 500 angstroms of the underlying monocrystalline material of the major region is etched away during the removal step. Because this elevates the emitter relative to the extrinsic base, the emitter-base peripheral capacitance is reduced.

At some point after creation of the patterned layer, part of the main impurity diffuses from the patterned layer into the primary zone to convert a surface-adjoining portion of it into the emitter. The patterned layer serves as the emitter contact. The intrinsic base consists of that part of the primary zone directly below the emitter.

An intermediate dopant of the second conductivity type is introduced, normally by ion implantation, into the major region through part of its upper surface to establish a surface-adjoining portion as an intermediate zone of the second conductivity type. The patterned layer and any insulating material along its sides function as a doping shield. The base connection zone consists of that part of the intermediate and primary zones extending between the intrinsic base portion and the (later formed) base contact zone.

The intermediate doping step enables the extrinsic base resistance to be controlled as a function of the concentration profile of the intermediate dopant. This effectively reduces the degree to which the extrinsic base resistance depends on the proximity of the emitter to the base contact zone. Furthermore, the intermediate dopant "replaces" like-conductivity dopant removed during the preceding etch into the major region. It thus becomes much easier to maintain the extrinsic base resistance at a low value from run to run without risking degradation of emitter-base junction characteristics.

Next, insulating spacers are formed along the sides of the patterned layer. The spacers have a greater mean lateral width than that of any insulating material located along the sides of the patterned layer during the intermediate doping step. A further dopant of the second conductivity type is introduced, usually by ion implantation, into the major region through part of its upper surface to establish a surface-adjoining portion as the base contact zone. The patterned layer and spacers act as a doping shield.

When the FET is included, its source/drain zones are created in a second major region spaced laterally apart from the first-mentioned major region. An insulating layer is provided along the upper surface of the second major region at an early point in the manufacturing process. A second patterned non-monocrystalline semiconductor layer is created on part of the upper surface of the insulating layer.

The remaining fabrication on the FET is done simultaneously with the bipolar transistor. In particular, the intermediate dopant of the second conductivity type is introduced into the second region to form a pair of auxiliary S/D zones of the second conductivity type. After forming insulating spacers along the sides of the second patterned layer, the further dopant of the second conductivity type is introduced into the second region to create a pair of main S/D zones of the second conductivity type respectively continuous with the auxiliary S/D zones.

The combination of the main and auxiliary S/D zones produces a lightly doped drain (LDD) structure. This is advantageous because the peak electric field is less than in a conventional FET. Reliability is enhanced. Furthermore, the amount by which the gate electrode overlaps the composite S/D regions so as to attain good FET performance is controlled by the intermediate dopant without having to drive the further dopant to a point where the emitter-base junction characteristics of the bipolar transistor are degraded.

BRIEF DESCRIPTION OF THE DRAWINGS

FIGS. 1a, 1b, 1c, 1d, 1e, 1f, 1g, 1h, 1i, 1j, 1k, 1l, 1m, and 1n are cross-sectional side structural views representing steps in a process for manufacturing a bipolar transistor and an insulated-gate FET according to the invention.

FIG. 2 is a top view of part of the structure in FIG. 1n. For convenience, the areas representing electrically conductive material in FIG. 2 are shaded the same as in FIG. 1n even though FIG. 2 is not a cross-sectional view. FIG. 1n is taken through plane 1n—1n in FIG. 2.

Like reference symbols are employed in the drawings and in the description of the preferred embodiments to represent the same or very similar item or items.

DESCRIPTION OF THE PREFERRED EMBODIMENTS

Figure 1A:
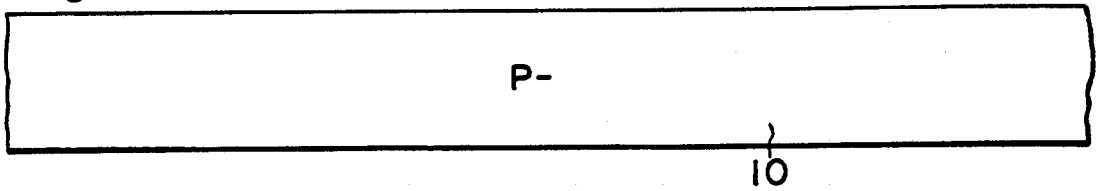

Referring to the drawings, FIGS. 1a-1n illustrate how a vertical NPN transistor and a P-channel insulated-gate FET of the LDD type are fabricated according to the teachings of the invention. Phosphorus, arsenic, and antimony are used selectively as the N-type semiconductor impurities for creating the various regions of N-type conductivity. Boron is the complementary P-type dopant. In the ion implantation steps described below, each of these elements is preferably implanted in its singly ionized form. The various anneals described below are used to repair implant lattice damage, activate the implanted species, and drive the species outward (by amounts depending on the species type and the anneal conditions). Certain of the implantations may be replaced by diffusions.

Conventional cleaning and photoresist masking techniques are utilized in the fabrication process. References to the cleaning steps, to the steps involved in making the photoresist masks, and to other such well-known semiconductor processing steps are omitted from the following description to simplify the discussion. Listings of the ingredients that form conventional etchants used in the process are omitted from the description for the same reasons.

An N-channel insulated-gate FET is typically fabricated with the P-channel FET and the NPN transistor in the overall device structure to achieve a bipolar/-complementary-FET arrangement. The additional steps needed for manufacturing the N-channel device are not given below since they are not material to the invention.

The starting point is a (100) P-type monocrystalline silicon substrate 10 having a resistivity of 15–25 ohm-cm. Substrate 10 has flat, parallel upper and lower surfaces as indicated in FIG. 1a. The terms "lower", "upper", "top", "side", "below", "above", "horizontal", "vertical", "lateral", and the like are defined (for convenience) with respect to the orientation of substrate 10 when its lower surface is parallel to the ground. Thin silicon dioxide layers (not shown) lie along the upper and lower substrate surfaces.

Figure 1B:
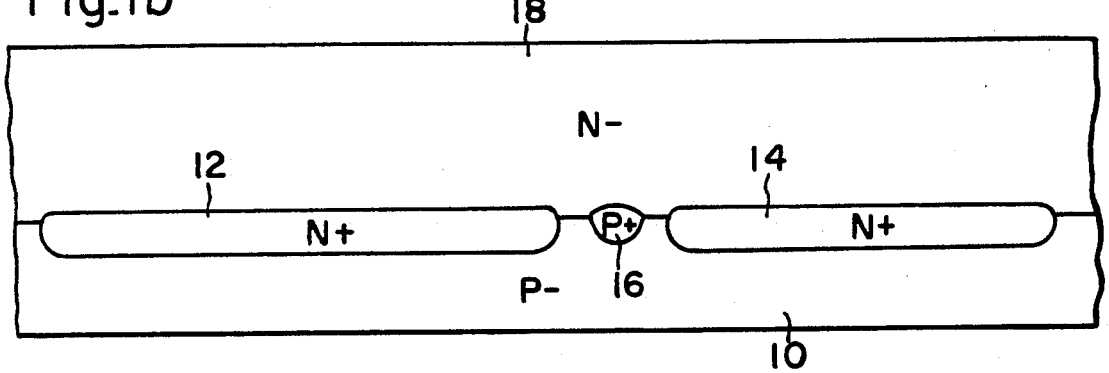

Substrate 10 is converted into the monocrystalline silicon body shown in FIG. 1b by selectively implanting antimony into the upper substrate material at the general locations for heavily doped N-type buried regions 12 and 14, thermally driving the antimony, selectively implanting boron into the upper substrate material at the general location for a heavily doped P-type buried web 16, removing about 1,400 angstroms of silicon along the upper substrate surface, and then growing an arsenic-doped (100) epitaxial layer 18 to a thickness of 12,000 angstroms. These operations are accomplished with the assistance of various thermal oxidation, masking, and etching steps of a conventional nature. The antimony implant dose is $2.4 \times 10^{15}$ ions/cm$^2$. The boron implant dose is $3 \times 10^{13}$ ions/cm$^2$. P+ buried web 16 laterally surrounds each of N+ buried regions 12 and 14. N− epitaxial layer 18 has a resistivity of about 0.4 ohm-cm.

Figure 1C:
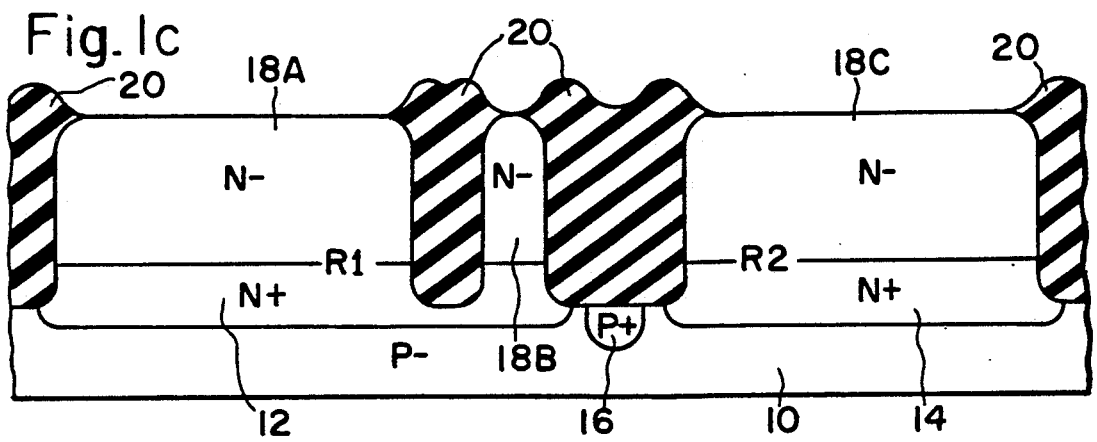

A recessed web-like isolation region 20 of silicon dioxide is formed along the upper silicon surface as depicted in FIG. 1c. Oxide-isolation region 20 penetrates all the way through epitaxial layer 18 and slightly into substrate 16. Region 20 is formed according to the well-known "LOCOS" technique. N+ buried regions 12 and 14 expand somewhat during the formation of oxide 20. P+ buried web 16 grows considerably.

The remaining portions of expitaxial layer 18 are represented as items 18A, 18B, and 18C. Portions 12, 18A, and 18B form a major N-type region R1 for the NPN transistor. Portions 14 and 18C form a major N-type region R2 for the P-channel FET. Oxide region 20 in combination with web 16 laterally separates regions R1 and R2.

Figure 1D:
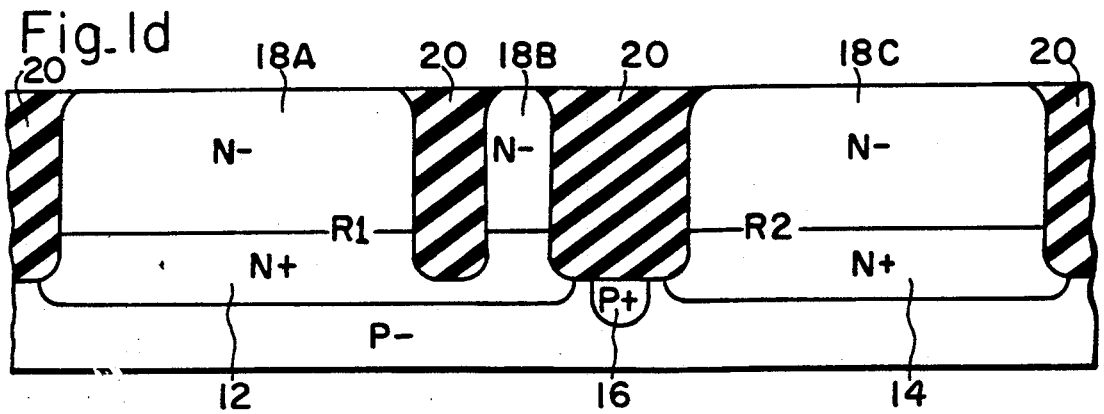

A planarization operation is performed to reduce the amount of upper surface roughness present at the end of the LOCOS operation. The preferred way for doing this entails thermally growing about 750 angstroms of silicon dioxide along the upper silicon surfaces and then depositing 3,000–5,000 angstroms of boro-phosphosilicate glass (BPSG) on the top of the resultant structure. The BPSG is provided with a largely planar upper surface by heating the structure at 1,000° C. for 30 minutes in dry oxygen. A combination of dry (plasma) and wet (chemical) etching is employed to remove a largely uniform thickness of the BPSG and silicon dioxide down to the upper silicon surface. FIG. 1d shows the result.

Layers 22A, 22B, and 22C of silicon dioxide are thermally grown along the upper surfaces of epitaxial portions 18A–18C to a thickness of 300 angstroms. See FIG. 1e. A photoresist mask 24 having an opening above portion 18B is then formed on the top of the structure. Phosphorus is implanted through oxide layer 22B into portion 18B of region R1 to form a heavily doped N-type collector contact zone 26. The implantation is performed at an energy of 80 kiloelectron volts (KEV) and a dosage of $2 \times 10^{15}$ ions/cm$^2$. In addition, arsenic may be implanted through oxide 22B into portion 18B at 120 KEV and $3 \times 10^{15}$ ions/cm$^2$. The arsenic remains near the upper monosilicon surface during subsequent processing steps to prevent blanket P-type implants from counterdoping N+ zone 26.

After removing photoresist 24, the structure is annealed at 1,000° C. for 90 minutes in nitrogen. N+ contact zone 26 moves downward during the anneal. An etch is then performed to remove oxide layers 22A–22C.

Layers 28A, 28B, and 28C of high-quality silicon dioxide are thermally grown to a thickness of 200 angstroms along the upper surfaces of N− portions 18A–18C. See FIG. 1f. Oxide layers 28A –28C are preferably created by subjecting the structure to dry oxygen and tri-chloroethane for 20 minutes at 950° C. and then annealing at the same temperature for 10 minutes in nitrogen to relieve oxide stress. Part of layer 28C later serves as the gate dielectric for the FET. By this time, N+ collector contact 26 has expanded substantially down to buried region 12.

A blanket layer 30 of amorphous silicon having a thickness of 250 angstroms is deposited on oxide region 20 and on oxide layers 28A–28C. Layer 30 protects oxide 28C from being damaged during subsequent photoresist mask fabrication.

Using a photoresist mask (not shown) having an opening above portion 18C, arsenic is implanted at a low dosage into region 18C to adjust the FET threshold voltage. The dose is typically $1 \times 10^{12}$ ions/cm$^2$.

After removing the preceding mask, fabrication of the base for the NPN transistor is initiated. A photoresist mask 32 having an opening above epitaxial portion 18A is formed on amorphous silicon layer 30 as indicated in FIG. 1f. An initial boron implantation is performed through layers 30 and 28A into portion 18A of region R1 to form a primary P-type zone 34 along the upper surface of portion 18A. The implant conditions are 20 KEV and $3\text{-}4 \times 10^{13}$ ions/cm$^2$. The boron reaches a peak concentration about 300 angstroms below the upper silicon surface of region R1.

With mask 32 in place, phosphorus is optionally implanted through layers 30 and 28A into portion 18A of region R1 at 180 KEV and $1\text{-}2 \times 10^{12}$ ions/cm$^2$. The phosphorus reaches a peak concentration about 2,000 angstroms below the upper surface of region R1. That is, the peak phosphorus concentration occurs at a greater implantation depth than the peak boron concentration. N-type region 36 generally indicates the location of the phosphorus implanted into portion 18A. The order in which P zone 34 and N region 36 are formed is not material.

With mask 32 still in place, the exposed portion of amorphous silicon layer 30 is removed. Oxide layer 28A is then etched away. After removing mask 32, the structure is annealed at 875° C. for 20 minutes in nitrogen. N layer 36 moves upward to meet P layer 34 and help limit its downward expansion as shown in FIG. 1g.

About 4,000 angstroms of amorphous silicon is deposited on the upper surface of the structure to create a blanket amorphous silicon layer 38. The remainder of layer 30 forms part of layer 38. A photoresist mask 40 having an opening above N+ portion 18A and usually above N+ zone 26 is preferably formed on layer 38. Arsenic is implanted into the exposed portion of layer 38 at $1 \times 10^{16}$ ions/cm$^2$ and 80 KEV. The dashed line in FIG. 1g indicates the separation between the heavily doped N-type amorphous silicon and the undoped amorphous silicon.

Figure 1H:
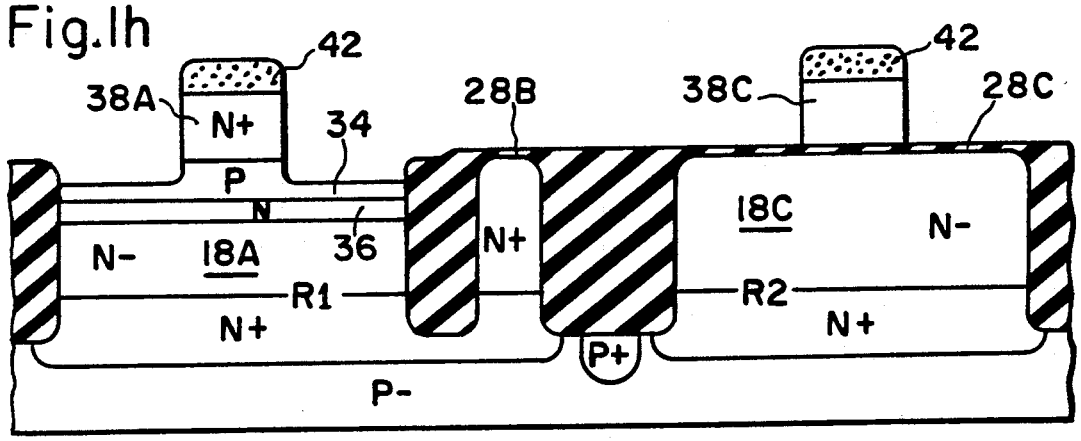

After removing photoresist 40, a photoresist mask 42 is formed on amorphous silicon layer 38 as shown in FIG. 1h. Mask 42 has blocking areas generally above the intended locations for the emitter of the NPN transistor and the gate electrode of the FET. A dry etch is performed to remove the entire thickness of the exposed portions of layer 38. The remaining portions consist of patterned amorphous silicon layers 38A and 38C. The dry etch is continued into P zone 34 to remove 500–1,500 angstroms of monosilicon generally situated to the sides of the intended emitter location. Mask 42 is subsequently removed.

Figure 1I:
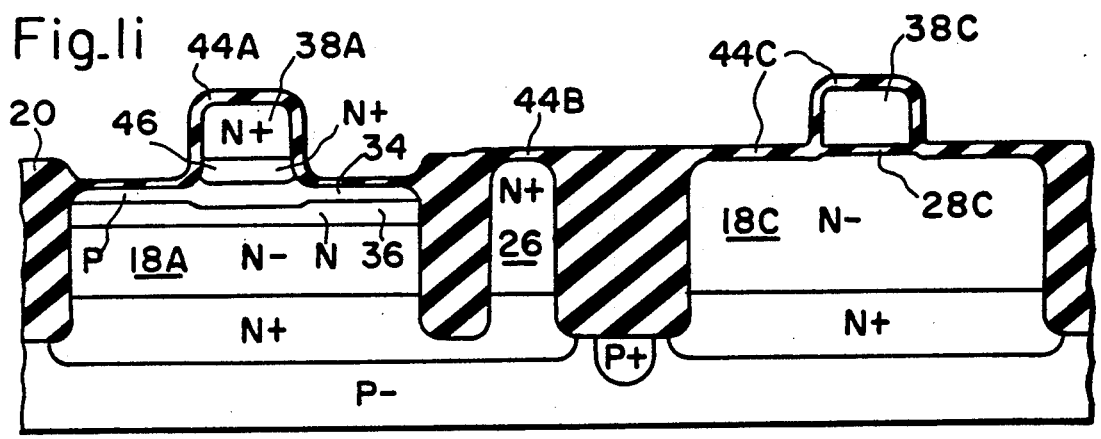

A thermal oxidation is performed to create layers 44A, 44B, and 44C of silicon dioxide from the exposed silicon along the upper surface of the structure, including the monosilicon below the exposed portions of oxide layers 28B and 28C. See FIG. 1i. The thermal oxidation is accomplished by subjecting the structure to dry oxygen for 10 minutes at 920° C. and then annealing at the same temperature for 20 minutes in nitrogen. The change in oxide thickness along the monosilicon at the top of the structure is about 125 angstroms. The oxide thickness along the amorphous silicon varies from 250 angstroms to 400 angstroms.

During the thermal oxidation, part of the arsenic in patterned amorphous silicon layer 38A diffuses into P zone 34 to form heavily doped N-type emitter 46. P zone 34 also expands downward slightly.

Figure 1J:
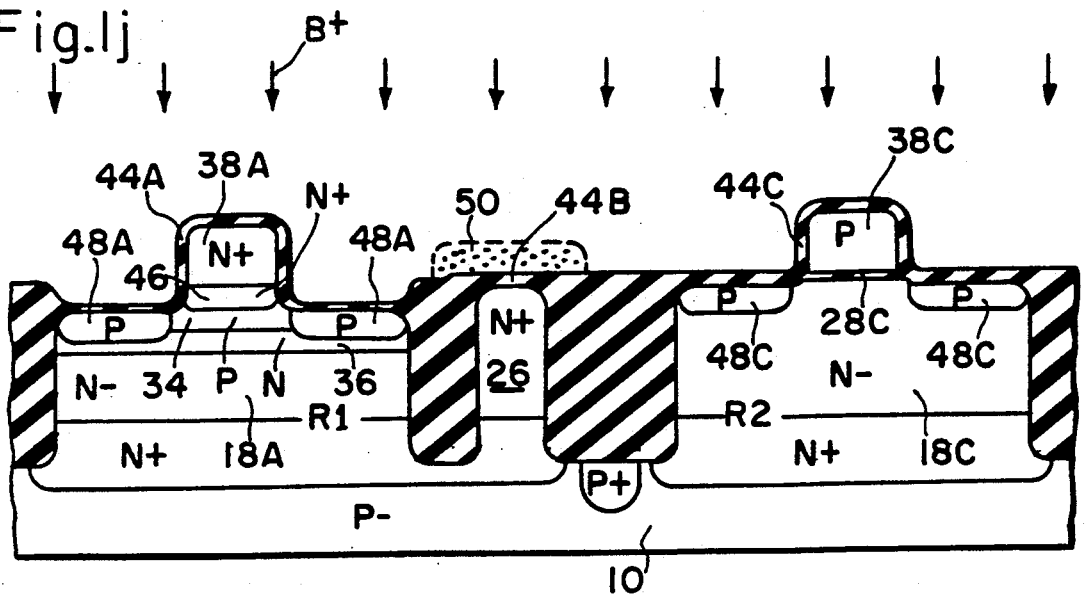

An intermediate boron implantation is performed into the material along the upper surface of the structure as shown in FIG. 1j in a direction substantially perpendicular to the lower surface of substrate 10. The implant conditions are $2.5 \times 10^{13}$ ions/cm$^2$ and 20 KEV. The boron passes through the horizontal portions of oxide layers 44A and 44C into the underlying silicon to form (1) a pair of laterally separated intermediate P-type zones 48A along the upper surface of P zone 34 in region R1 and (2) a pair of laterally separated auxiliary P-type S/D zones 48C along the upper surface of portion 18C in region R2. See FIG. 1j. Patterned layers 38A and 38C and the vertical portions of oxide layers 44A and 44C act as an implantation shield to prevent the boron from entering the portions of regions R1 and R2 that they cover.

The intermediate boron implant does not have any significant effect on the doping of patterned layer 38A. However, patterned layer 38C becomes P doped. N+ contact zone 26 may be protected by a photoresist mask 50 which is removed after the implantation. If mask 50 is not used, the implant does not significantly affect the doping of zone 26.

Electrically insulating spacers 52A and 52C are provided along the sides of patterned layers 38A and 38C as shown in FIG. 1k. In particular, 3,000-5,000 angstroms of silicon dioxide is deposited on the top of the structure after which a highly anisotropic dry etch is performed to remove all of the deposited and thermally grown oxide except for sidewall spacers 52A and 52C. Oxide layers 44A-44C are thereby substantially removed except for the portions incorporated into spacers 52A and 52C.

A thermal oxidation is performed to densify spacers 52A and 52C and to create silicon dioxide layers 54A, 54B, and 54C from the exposed silicon along the upper structural surface. See FIG. 1l. The oxidation is done in nitrogen with 10% oxygen for 30 minutes at 875° C. The resulting oxide thickness along the monosilicon is about 100 angstroms. The oxide thickness along the non-monocrystalline silicon is about 200 angstroms. A layer 56 of silicon dioxide is then deposited on the top of the structure to a thickness of 300-500 angstroms. Spacers 52A and 52C include the adjoining portions of oxide layer 56.

The mean lateral spacer width—i.e., the width of each of spacers 52A and 52C at approximately half their height—is 2,000-4,000 angstroms. This is much greater than the mean lateral width (or thickness) of each of the vertical portions of oxide layers 44A and 44C. In other words, the mean lateral width of spacers 52A or 52C is much greater than the mean lateral width of the oxide lying along the sides of patterned layer 38A or 38C during the previous boron implantation. Spacers 52A or 52C thereby overlap P region 48A or 48C by a considerable amount, typically 3,000 angstroms on each side.

A further boron implantation is performed into the material along the upper surface of the structure in a direction substantially perpendicular to the lower substrate surface. The implant conditions are $5-10 \times 10^{14}$ ions/cm$^2$ and 25 KEV. As indicated in FIG. 1l, the boron passes through oxide layers 56, 54A, and 54C into the underlying silicon to form (1) a pair of laterally separated heavily doped P-type base contact zones 58A along the upper surfaces of P zones 48A in region R1 and (2) a pair of laterally separated heavily doped main P-type S/D zones 58C along the upper surfaces of P zones 48C in region R2. Patterned layers 38A and 38C and spacers 52A and 52C (including the adjoining portions of oxide 56) act as an implantation shield to protect the silicon that lies below them.

The further boron implantation does not significantly affect the doping of layer 38A. Layer 38C becomes heavily P doped. Contact zone 26 may be protected by a photoresist mask 60 which is removed after the implantation. If mask 60 is not present, the doping of zone 26 is still not significantly affected provided that the above-mentioned arsenic implant into region 18B was performed.

A rapid thermal anneal (RTA) is performed on the structure for 1-20 seconds at 1,000° C. or more in an inert environment. The RTA is preferably done for 10 seconds at 1,050° C. in nitrogen. In addition to activating the just-implanted boron and repairing lattice damage, the RTA breaks up any thin native silicon dioxide layer (typically no more than 20 angstroms thick) present along the interface between emitter 46 and overlying patterned layer 38A. The structure may also be annealed at 800°-900° C. for 30 minutes in nitrogen. During the anneal(s), P zones 48A and 48C and P+ zones 58A and 58C expand to the positions generally shown in FIG. 1m.

A wet etch is performed to remove oxide layers 56 and 54A-54C. Spacers 52A and 52C are otherwise left substantially intact. Due to the various high-temperature operations that the structure has undergone, the silicon in layers 38A and 38C is now substantially polycrystalline.

Patterned layer 38 is the emitter contact for the NPN transistor. The intrinsic base portion, which substantially consists of that part of P zone 34 directly under emitter 46, has a width (in the vertical direction) of approximately 1,500 angstroms. There are two base connection zones, each largely consisting of the portions of P zones 34 and 48A that extend between the intrinsic base and one of base contact zones 58A.

The depth of each P zone 48A is 500-1,500 angstroms greater than that of P zone 34 because of the etching into the monosilicon during the patterning of layer 38. As a result, each base connection zone is deeper than the intrinsic base. In addition, each base connection zone has a greater dopant concentration than the intrinsic base. These two factors enable the connection zones to transmit the base current at a very low resistance.

Due to the enhanced process control provided by the intermediate base implant, the resistance per unit length (in the direction perpendicular to the plane of FIG. 1m) of the composite extrinsic base formed by the two connection zones in combination with contact zones 58A falls into a range of 30-100 ohms/micron from run to run. The peripheral emitter-base capacitance per unit length is 0.25 femtofarad/micron or less. As a result, the NPN device has a high switching speed. The emitter-base breakdown voltage typically equals 6 volts and, in any case, does not fall below 5 volts.

The collector for the NPN device consists of N+ regions 12 and 26 and the remaining N-type portions of regions 18A and 36. Buried region 12 serves both as the main (or active) part of the collector and as a connection zone to collector contact zone 26.

Layer 38C is the gate electrode for the P-channel FET. The remainder of oxide layer 28C is the gate dielectric. Each pair of continuous S/D portions 48C and 58C forms a composite source/drain zone in an LDD configuration. Gate electrode 38C overlaps the LDD portion of each of the composite S/D zones by an amount that falls into a run-to-run range of 500-1,000 angstroms. This is adequate to achieve very good FET operation.

The structure is subsequently provided with a first metallization layer for an electrical interconnection system. Platinum is blanket deposited on the upper surface of the structure to the thickness of 250-350 angstroms. The platinum on the silicon areas is reacted with the underlying silicon according to the conventional "salicide" technique to form PtSi layers 62A, 62B, and 62C as indicated in FIG. 1n. The unreacted platinum (located on the oxide areas) is removed.

Titanium-tungsten is deposited on the upper surface to a thickness of 1,000 angstroms. This is followed by 3,000 angstroms of aluminum with 1% copper and then another 1,000 angstroms of titanium-tungsten. Using a photoresist mask (not shown), the exposed portions of the upper Ti-W layer are removed. After removing the photoresist, the exposed portions of the aluminum are etched away using the remainder of the upper Ti-W layer as a shield. The remaining portions of the aluminum are denoted as items 64A, 64B, and 64C in FIG. 1n.

Using Al portions 64A-64C as a shield, the remainder of the upper Ti-W layer and the exposed portions of the lower Ti-W layer are removed. The remaining portions of the lower Ti-W are denoted as items 66A, 66B, and 66C. This completes the first metallization layer. Additional processing on the structure can be done in a conventional way.

Turning to FIG. 2 it shows a top view of the first-level metallization pattern for the NPN transistor. Al layer 64A for base contact zones 58A is shaped like an upside down "U" to contact both of zones 58A. The dashed line in FIG. 2 represents the inside walls of oxide-isolation region 20.

While the invention has been described with reference to particular embodiments, this description is solely for the purpose of illustration and is not to be construed as limiting the scope of the invention claimed below. For example, certain of the processing steps may be performed in a different order. The portion of amorphous silicon layer 30 exposed through mask 32 could be removed before, rather than after, forming P zone 34 and N region 36. The same applies to oxide layer 28A. Emitter 46 could be formed after creating intermediate P zones 48A and 48C.

The thermal oxidation to form oxide layers 44A-44C could be eliminated. In this case, only patterned layers 38A and 38C would act as an implantation shield over epitaxial portions 18A and 18C during the implantation of P zones 48A and 48C. The major part of the width of sidewall spacers 52A and 52C could be created by thermal oxidation rather than oxide deposition.

Polysilicon may be used to create non-monocrystalline layers 30 and 38. By eliminating mask 40, patterned layer 38C for the gate electrode could be doped N-type. The FET threshold voltage would then be adjusted by implanting a P-type impurity into N— layer 18C. Semiconductor materials of opposite conductivity to those described above may be employed to achieve the same results. Various modifications and applications may thus be made by those skilled in the art without departing from the true scope and spirit of the invention as defined in the appended claims.

We claim:

1. A method of fabricating a bipolar transistor from a monocrystalline semiconductor body that comprises a major region of a first conductivity type located along an upper surface of the body, the method comprising the steps of:

introducing an initial dopant of a second conductivity type opposite to the first conductivity type into the major region to convert a surface-adjoining portion into a primary zone of the second conductivity type;

creating a patterned electrically conductive layer above the primary zone so as to contact part of its upper surface;

introducing a main impurity of the first conductivity type into the primary zone through part of its upper surface to convert a surface-adjoining portion into an emitter of the first conductivity type;

introducing an intermediate dopant of the second conductivity type into the major region through part of its upper surface to establish a surface-adjoining portion as an intermediate zone of the second conductivity type using the patterned layer and any electrically insulating material along its sides as a shield for blocking the intermediate dopant from passing through the directly underlying section of the upper surface of the major region;

forming electrically insulating spacers along the sides of the patterned layer to a mean lateral width greater than that of any electrically insulating material located along the sides of the patterned layer during the previous step; and introducing a further dopant of the second conductivity type into the major region through part of its upper surface to establish a surface-adjoining portion as a base contact zone of the second conductivity type laterally separated from the emitter using the patterned layer and spacers as a shield for blocking the further dopant from passing through the directly underlying section of the upper surface of the major region, the intermediate zone being continuous with the primary zone and the base contact zone to form a base of the second conductivity type.

2. A method as in claim 1 wherein the base comprises the base contact zone, an intrinsic base portion consisting largely of that part of the primary zone directly below the emitter, and a base connection zone consisting largely of that part of the intermediate and primary zones extending between the intrinsic portion and the contact zone.

3. A method as in claim 2 wherein the step of introducing the main impurity of the first conductivity type is performed by outdiffusing the main impurity from the patterned layer.

4. A method as in claim 3 wherein the first and second conductivity types respectively are N-type and P-type.

5. A method as in claim 3 including, prior to the step of creating the patterned layer, the step of introducing a preliminary impurity of the first conductivity type into the major region through its upper surface to an average depth therebelow greater than that of the initial dopant of the second conductivity type.

6. A method as in claim 5 including, subsequent to the step of forming the spacers, the step of heating the body and adjoining material for 1–20 seconds at 1,000° C. or more.

7. A method of fabricating a bipolar transistor from a monocrystalline semiconductor body that comprises a major region of a first conductivity type located along an upper surface of the body, the method comprising the steps of:

introducing an initial dopant of a second conductivity type opposite to the first conductivity type into the major region through its upper surface to convert a surface-adjoining portion of it into a primary zone of the second conductivity type;

creating a patterned electrically conductive non-monocrystalline semiconductor layer above the primary zone so as to contact part of its upper surface, the patterned layer containing a main impurity of the first conductivity type;

diffusing part of the main impurity of the first conductivity type from the patterned layer into the primary zone to convert a portion of the primary zone into an emitter of the first conductivity type;

ion implanting an intermediate dopant of the second conductivity type into the major region through part of its upper surface to establish a surface-adjoining portion of it as an intermediate zone of the second conductivity type using the patterned layer and any electrically insulating material along its sides as an implantation shield;

forming electrically insulating spacers along the sides of the patterned layer such that the mean lateral width of the spacers is greater than the mean lateral width of any electrically insulating material located along the sides of the patterned layer during the ion implantation of the intermediate dopant; and ion implanting a further dopant of the second conductivity type into the major region through part of its upper surface to establish a surface-adjoining portion of it as a base contact zone of the second conductivity type laterally separated from the emitter using the patterned layer and spacers as an implantation shield, the intermediate zone being continuous with the primary zone and the base contact zone to form a base of the second conductivity type.

8. A method as in claim 7 wherein the base comprises the base contact zone, an intrinsic base portion consisting substantially of that part of the primary zone located directly below the emitter, and a base connection zone consisting substantially of that part of intermediate and primary zones extending between the intrinsic portion and the contact zone.

9. A method as in claim 7 wherein the step of creating the patterned layer involves:
   providing the upper surface of the body and any overlying material with a blanket non-monocrystalline semiconductor layer doped with the main impurity of the first conductivity type;
   removing substantially the entire thickness of portions of the blanket layer situated to the sides of the intended location for the emitter; and
   continuing the removal step by etching into the major region along its upper surface to remove at least 500 angstroms of material situated to the sides of the intended location for the emitter.

10. A method as in claim 7 wherein the semiconductor body has a substantially flat lower surface, the ion implantation of each of the intermediate and further dopants being performed in a direction substantially perpendicular to the lower surface of the body.

11. A method as in claim 7 including, prior to the step of creating the patterned layer, the step of ion implanting a preliminary impurity of the first conductivity type into the major region through its upper surface to an average depth therebelow greater than that of the initial dopant of the second conductivity type.

12. A method as in claim 7 wherein: the step of introducing the initial dopant of the second conductivity type is done by ion implantation; and, prior to creating the patterned layer, a preliminary impurity of the first conductivity type is ion implanted into the major region through its upper surface at an energy sufficient to enable the preliminary impurity to reach a peak concentration at an average depth greater than that at which the initial dopant reaches its peak concentration.

13. A method as in claim 7 including, subsequent to the step of forming the spacers, the step of heating the body and adjoining material for 1-20 seconds at 1,000° C. or more.

14. A method as in claim 7 wherein the first and second conductivity types respectively are N-type and P-type.

15. A method of fabricating a bipolar transistor and a field-effect transistor from a monocrystalline semiconductor body that comprises first and second major regions of a first conductivity type spaced laterally apart from each other along an upper surface of the body, the method comprising the steps of:

introducing an initial dopant of a second conductivity type opposite to the first conductivity type into the first region through its upper surface to convert a surface-adjoining portion of the first region into a primary zone of the second conductivity type;
providing an electrically insulating layer along the upper surface of the second region;
creating a first patterned electrically conductive non-monocrystalline semiconductor layer above the primary zone so as to contact part of its upper surface, the first patterned layer doped with a main impurity of the first conductivity type;
creating a second patterned non-monocrystalline semiconductor layer on the upper surface of part of the insulating layer;
ion implanting an intermediate dopant of the second conductivity type into the major regions through parts of their then-existing upper surfaces to establish a surface-adjoining portion of the first region as an intermediate zone of the second conductivity type and to establish a pair of laterally separated surface-adjoining portions of the second region as auxiliary source/drain zones of the second conductivity type using the patterned layers and any electrically insulating material along their sides as an implantation shield;
forming electrically insulating spacers along the sides of the patterned layers to a greater mean lateral width than that of any electrically insulating material lying along the sides of the patterned layers during the ion implantation of the intermediate dopant;
diffusing part of the main impurity of the first conductivity type from the first patterned layer into the primary zone to convert a portion of it into an emitter of the first conductivity type; and
ion implanting a further dopant of the second conductivity type into the major regions through parts of their then-existing upper surfaces to establish a surface-adjoining portion of the first region as a base contact zone of the second conductivity type laterally separated from the emitter and to establish a pair of laterally separated surface-adjoining portions of the second region as main source/drain zones of the second conductivity type respectively continuous with the auxiliary source/drain zones using the spacers and the patterned layers as an implantation shield, whereby the intermediate zone is continuous with the primary zone and the base contact zone to form a base of the second conductivity type.

16. A method as in claim 15 wherein the base comprises the base contact zone, an intrinsic base portion consisting substantially of that part of the primary zone located directly below the emitter, and a base connection zone consisting substantially of that part of intermediate and primary zones extending between the intrinsic portion and the contact zone.

17. A method as in claim 15 wherein the steps of creating the patterned layers involve:
   depositing a blanket non-monocrystalline semiconductor layer over the then-existing upper surfaces of the first region and the insulating layer;
   introducing the main impurity of the first conductivity type into the portion of the blanket layer above the first region; and removing substantially the entire thickness of portions of the blanket layer situated to the sides of the intended locations for the patterned layers.

18. A method as in claim 17 wherein the step of removing includes etching into the first region along its then-existing upper surface to remove material situated to the sides of the intended location for the emitter.

19. A method as in claim 17 wherein the steps of ion implanting the intermediate and further dopants of the second conductivity type include ion implanting at least one of them into the second patterned layer.

20. A method as in claim 15 wherein the steps of introducing the initial dopant of the second conductivity type, providing the insulating layer, and creating the patterned layers involve:
   forming first and second insulating layers respectively along the then-existing upper surfaces of the first and second regions;
   depositing an initial blanket layer of non-monocrystalline semiconductive material on the first and second insulating layers and on any material between them;
   ion implanting the initial dopant of the second conductivity type selectively into the first region but not into the second region;
   removing the portion of the initial blanket layer over the first insulating layer;
   removing the first insulating layer;
   forming a further blanket layer of non-monocrystalline semiconductor material over the then-existing upper surface of the primary zone and over the remainder of the initial blanket layer;
   introducing the main impurity of the first conductivity type into at least a portion of the further blanket layer above the first region; and
   removing non-monocrystalline semiconductor material situated to the sides of the intended locations for the patterned layers.

* * * * *